US007134010B2

(12) United States Patent
Lin et al.

(10) Patent No.: US 7,134,010 B2
(45) Date of Patent: **\*Nov. 7, 2006**

(54) NETWORK INTERFACE WITH DOUBLE DATA RATE AND DELAY LOCKED LOOP

(75) Inventors: Jonathan Lin, Fremont, CA (US); Yong Jiang, Fremont, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/149,182

(22) Filed: Jun. 10, 2005

(65) Prior Publication Data

US 2005/0268140 A1    Dec. 1, 2005

Related U.S. Application Data

(63) Continuation of application No. 10/083,291, filed on Feb. 27, 2002, now Pat. No. 6,920,552.

(60) Provisional application No. 60/276,104, filed on Mar. 16, 2001.

(51) Int. Cl.
*G03F 7/38* (2006.01)

(52) U.S. Cl. ......................................................... 713/1

(58) Field of Classification Search ..................... None
See application file for complete search history.

(56) References Cited

U.S. PATENT DOCUMENTS

| | | | | |
|---|---|---|---|---|
| 5,151,624 A | * | 9/1992 | Stegherr et al. | ............ 327/356 |
| 5,459,717 A | | 10/1995 | Mullan et al. | |
| 5,923,621 A | * | 7/1999 | Kanekal et al. | ............ 368/117 |
| 6,253,066 B1 | * | 6/2001 | Wilhite et al. | ............... 455/108 |
| 6,292,016 B1 | * | 9/2001 | Jefferson et al. | ............... 326/39 |
| 6,385,710 B1 | * | 5/2002 | Goldman et al. | ........... 711/169 |
| 6,404,250 B1 | * | 6/2002 | Volrath et al. | ............... 327/160 |
| 6,425,015 B1 | | 7/2002 | Jennings et al. | |
| 6,437,619 B1 | * | 8/2002 | Okuda et al. | ................ 327/158 |
| 6,654,897 B1 | * | 11/2003 | Dreps et al. | ................. 713/401 |
| 6,920,552 B1 | * | 7/2005 | Lin et al. | ........................ 713/1 |
| 6,934,866 B1 | * | 8/2005 | Lin et al. | .................... 713/401 |
| 2005/0268138 A1 | * | 12/2005 | Lin et al. | .................... 713/400 |

FOREIGN PATENT DOCUMENTS

| WO | WO 99/00945 | 1/1999 |
|---|---|---|
| WO | WO 99/00950 | 1/1999 |

* cited by examiner

*Primary Examiner*—Lynne H. Browne
*Assistant Examiner*—Anand B. Patel
(74) *Attorney, Agent, or Firm*—Squire, Sanders & Dempsey, LLP.

(57) ABSTRACT

A network device is provided which includes a device input, at least one port, a frequency doubler, a data I/O device, and a programmable delay locked loop. The frequency doubler is coupled to the input and configured to receive an input signal and output an output signal having double the frequency of the input signal. The data I/O device is configured to output data based upon a reference clock signal. The programmable delay locked loop is coupled to the device input and configured to receive an input signal and to automatically output an output signal being a predetermined amount out of phase from the input signal. An external clock signal received at the device input is input to the frequency doubler. The output of the frequency doubler is input to the data I/O device as a reference clock. Data (e.g., from internal device logic) is output from the data I/O device to the at least one port. The external clock signal is input to the programmable delay locked loop, which outputs an output clock signal having a frequency equal to the frequency of the external clock signal, in synchronization with the data being output.

26 Claims, 13 Drawing Sheets

NETWORK INTERFACE WITH DOUBLE DATA RATE AND DELAY LOCKED LOOP

REFERENCE TO RELATED APPLICATIONS

This is a Continuation of application Ser. No. 10/083,291, filed Feb. 27, 2002 now U.S. Pat No. 6,920,552, which claims priority of U.S. Provisional Patent Application Ser. No. 60/276,104 entitled "2.5G Bit Ethernet Interface Design Using DLL to Enhance Performance and Yield," filed on Mar. 16, 2001, the contents of which are hereby incorporated by reference.

BACKGROUND OF THE INVENTION

1. Field of the Invention

The invention relates to systems and methods for transmitting data between network devices. In particular, the invention relates to systems and methods for linking network devices at high speeds using double the data rate (DDR) and a delay locked loop to synchronize the output clock with the data.

2. Description of the Related Art

As computer performance has increased in recent years, the demands on computer networks has also increased; faster computer processors and higher memory capabilities need networks with high bandwidth capabilities to enable high speed transfer of significant amounts of data. The well-known Ethernet technology, which is based upon numerous IEEE Ethernet standards, is one example of computer networking technology which has been able to be modified and improved to remain a viable computing technology. A more complete discussion of prior art networking systems can be found, for example, in SWITCHED AND FAST ETHERNET, by Breyer and Riley (Ziff-Davis, 1996), and numerous IEEE publications relating to IEEE 802 standards. Based upon the Open Systems Interconnect (OSI) 7-layer reference model, network capabilities have grown through the development of repeaters, bridges, routers, and, more recently, "switches", which operate with various types of communication media. Thickwire, thinwire, twisted pair, and optical fiber are examples of media which has been used for computer networks. Switches, as they relate to computer networking and to ethernet, are hardware-based devices which control the flow of data packets or cells based upon destination address information which is available in each packet. A properly designed and implemented switch should be capable of receiving a packet and switching the packet to an appropriate output port at what is referred to wirespeed or linespeed, which is the maximum speed capability of the particular network. Current basic Ethernet wirespeeds typically range from 10 Megabits per second (Mps) up to 10,000 Mps, or 10 Gigabits per second. As speed has increased, design constraints and design requirements have become more and more complex with respect to following appropriate design and protocol rules and providing a low cost, commercially viable solution.

Competition and other market pressures require the production of more capable network devices that cost less. Increased network and device speed is required by customers. In order to support high performance network solutions, new and improved systems and methods are needed for linking network devices, such as linking high performance switches with one another.

One system or method of improving linking performance includes increasing the speed of the external clock or of the board clock speed. Faster clock speed means faster data speeds. However, faster and more reliable clocks are more expensive and are therefore not preferred by manufacturers. Furthermore, devices are often constructed on printed circuit boards (PCB), which are manufactured to within certain tolerances. On-board clock speeds for PCBs are often limited by manufacturing tolerances, and mass produced PCB's may not be able to handle the same clock cycle rates as silicon chips. Increasing the quality of a PCB to handle faster clock speeds decreases manufacturing yield, and can also be very expensive. Therefore, new and improved systems and methods are needed for increasing linking speeds between network devices without increasing the speed external clocks or changing the design of the PCB. Such systems and methods should also take into account variations in chip material speeds due to process or operating conditions.

SUMMARY OF THE INVENTION

According to an embodiment of the invention, a network device is provided which includes a device input, at least one port, a frequency doubler, a data I/O device, and a programmable delay locked loop. The frequency doubler is coupled to the input and configured to receive an input clock signal and output an output clock signal having double the frequency of the input clock signal. The data I/O device is configured to output data based upon a reference clock signal. The programmable delay locked loop is coupled to the device input and configured to receive an input signal and to automatically output an output signal being a predetermined amount out of phase from the input signal. An external clock signal received at the device input is input to the frequency doubler. The output of the frequency doubler is input to the data I/O device as a reference clock. Data (e.g., from internal device logic) is output from the data I/O device to the at least one port. The external clock signal is input to the programmable delay locked loop, which outputs an output clock signal having a frequency equal to the frequency of the external clock signal, in synchronization with the data being output.

According to another embodiment of the present invention, a network device is provided which includes a device input means, at least one port, a frequency doubler means, a data I/O means, and a programmable delay locked loop means. The device input means is for receiving an external clock signal. The frequency doubler means is coupled to the input for receiving an input clock signal and outputting a doubled output clock signal having double the frequency of the input clock signal. The data I/O means is for outputting data based upon a reference clock signal. The programmable delay locked loop means is coupled to the device input and for receiving an input clock signal and automatically outputting an output clock signal being a predetermined amount out of phase from the input signal. An external clock signal received at the device input is input to the frequency doubler means. The doubled output clock signal of the frequency doubler means is applied to the data I/O means as a reference clock. The data is output from the data I/O means to the at least one port. The external clock signal is input to the programmable delay locked loop means. The programmable delay locked loop means outputs an output clock signal having a frequency equal to the frequency of the external clock signal, in synchronization with the data to be output of the device.

According to another embodiment of the present invention, a method for linking network devices is provided. The method includes a step for receiving an external clock signal at a first device. The external clock signal received by the first device is split into a first input clock signal and a second input clock signal within the first device. The frequency of the first input clock signal is doubled. Data is output from the first device based on the doubled clock signal at double the data rate of the external clock signal, wherein the data is output at a port of the first device. The data is delayed before it is outputted from the first device. The second input clock signal is delayed a predetermined amount out of phase, and then provided to the port of the first device. The second input clock signal is delayed in order to synchronize the second input clock signal with the data, and the second input clock signal and the data are transmitted in parallel out of the device at the port.

According to another embodiment of the present invention, a network device is provided including a first switch, a second switch, a circuit integrating the two switches, and an external clock. The first switch includes a clock input for receiving an external clock signal, a first plurality of ports, a frequency doubler, an I/O device, a variable delay circuit and a programmable delay locked loop. The frequency doubler is coupled to the clock input and configured to receive an input signal and to output an output signal having a frequency double that of the input signal. The I/O device is configured to output data (e.g., from internal switch logic) to at least one of the plurality of ports based on a first reference clock signal. The programmable delay locked loop is coupled to the clock input and configured to receive an input signal and to automatically output an output signal being a preset amount out of phase from the input signal. The second switch includes a second plurality of ports and a double data rate receiving unit. The double data rate receiving unit is configured to receive data along with second reference clock signal from at least one of the second plurality of ports, and to sample said data based on a rising edge and a falling edge of the second reference clock signal. The external clock is couple to the first switch. The circuit couples a first link port of the first plurality of ports to a second link port of the second plurality of ports. The external clock signal received at the clock input of the first switch from the external clock is input into the frequency doubler. The output of the frequency doubler is input to the I/O device as a first reference clock signal. The I/O device outputs the data to the first link port via the variable delay circuit. The variable delay circuit delays the data. The external clock signal is also input to the programmable delay locked loop. The output of the programmable delay locked loop is provided to the first link port, such as via a circuit. The first switch is configured to output the data and the external clock signal from the link port in parallel to the second link port of the second switch via the circuit. The second switch is configured to receive the data and the external clock signal, and to input the external clock signal (as a second reference clock) and the data to the double data rate receiving unit, which samples the data at double data rate.

According to another embodiment of the present invention, a network device is provided including a first switch means, a second switch means, a circuit integrating the two switch means, and an external clock means. The first switch means includes a clock input for receiving an external clock signal, a first plurality of ports, a frequency doubler means, an I/O means, a variable delay circuit means and a programmable delay locked loop means. The frequency doubler means is coupled to the clock input for receiving an input signal and outputting an output signal with a frequency double that of the input signal. The I/O means is for outputting data to at least one of the plurality of ports based on a first reference clock signal. The programmable delay locked loop means is coupled to the clock input and for receiving an input signal and automatically outputting an output signal being a predetermined amount out of phase from the input signal. The second switch means includes a second plurality of ports and a double data rate receiving means. The double data rate receiving means is for receiving data and a second reference clock signal from at least one of the second plurality of ports, and for sampling said data based on a rising edge and a falling edge of the second reference clock signal. The external clock means is couple to the first switch and for supplying the external clock signal. The circuit means is for coupling a first link port of the first plurality of ports to a second link port of the second plurality of ports. The external clock signal received at the clock input of the first switch from the external clock is input into the frequency doubler means. The output of the frequency doubler means is input to the I/O means as a first reference clock signal. The I/O means outputs the data to the first link port via the variable delay circuit means. The variable delay circuit means delays the data. The external clock signal is also input to the programmable delay locked loop means. The output of the programmable delay locked loop means is provided to the first link port. The first switch means is configured to output the data and the external clock signal from the link port in parallel to the second link port of the second switch means via the circuit means. The second switch means is configured to receive the data and the external clock signal, and to input the external clock signal (as a second reference clock) and the data to the double data rate receiving unit means, which extracts the data at double data rate.

BRIEF DESCRIPTION OF THE DRAWINGS:

The objects and features of the invention will be more readily understood with reference to the following description and the attached drawings, wherein.

DETAILED DESCRIPTION OF THE PREFERRED EMBODIMENTS

Figure 1:
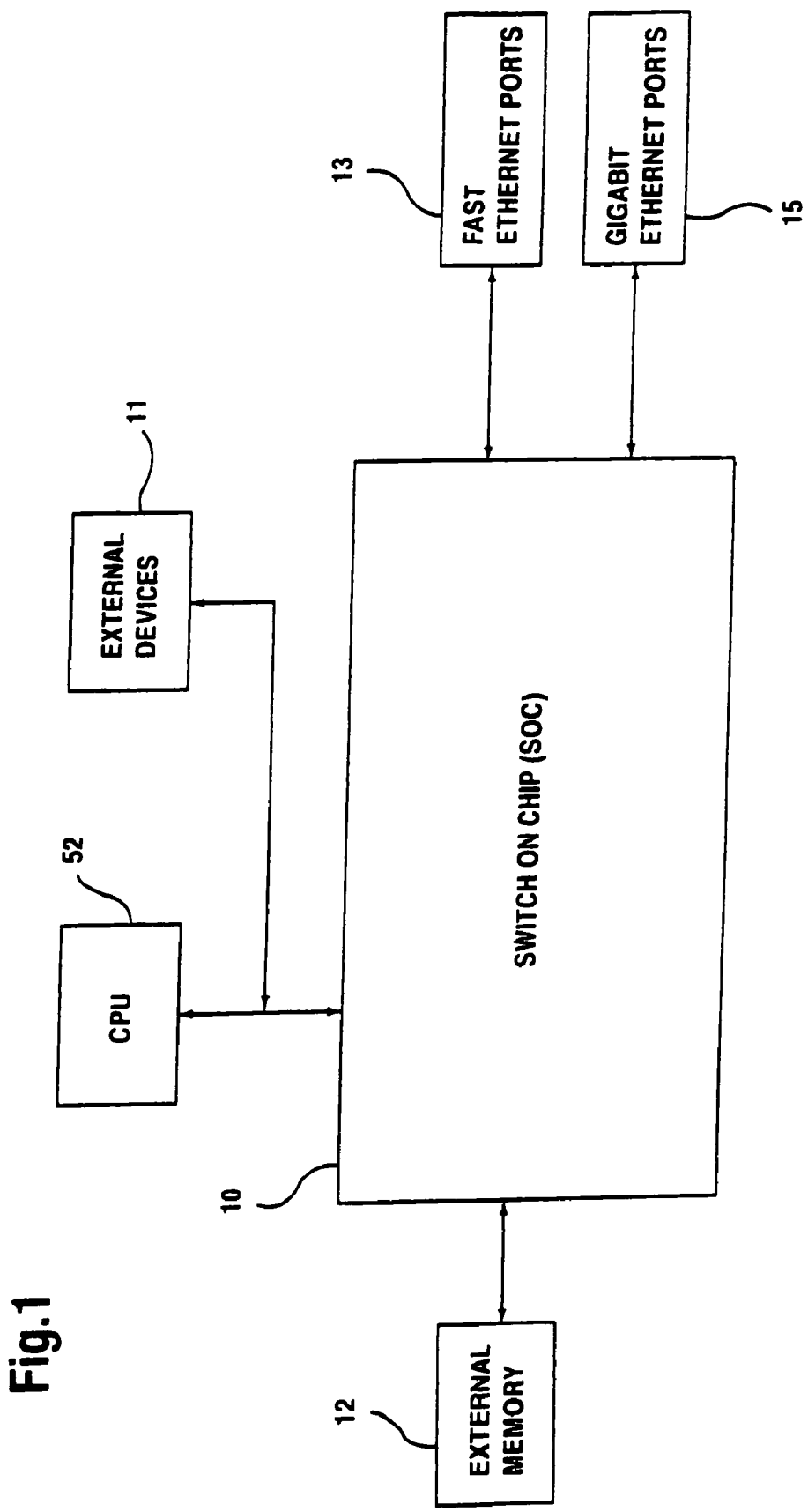
FIG. 1 is a general block diagram of an exemplary network device according to the invention.

FIG. 1 is a basic block diagram of an exemplary high-speed network device to which the present invention is applicable. An exemplary configuration of a network switch is shown. A switch-on-chip (SOC) 10 is functionally connected to external devices 11, external memory 12, fast ethernet ports 13, and gigabit ethernet ports 15. For the purposes of this discussion, fast ethernet ports 13 will be considered low speed ethernet ports, since they are capable of operating at speeds ranging from 10 Mbps to 100 Mbps in this example, while the gigabit ethernet ports 15 or link ports, which are high speed ethernet ports, are capable of operating at 1000 Mbps or higher in this example. External devices 11 could include other switching devices for expanding switching capabilities, or other devices as may be required by a particular application. External memory 12 can be additional off-chip memory, which is in addition to internal memory (on-chip) which is located on SOC 10, which will be discussed below. CPU 52 can be used as desired to program SOC 10 with rules which are appropriate to control packet processing. However, once SOC 10 is appropriately programmed or configured, SOC 10 operates, as much as possible, in a free running manner without communicating with CPU 52. CPU 52 does not control every aspect of the operation of SOC 10, because CPU 52 performance requirements are fairly low in this example, at least with respect to SOC 10. A less powerful and therefore less expensive CPU 52 can therefore be used when compared to known network switches. As also will be discussed below, SOC 10 utilizes external memory 12 in an efficient manner so that the cost and performance requirements of memory 12 can be reduced. Internal memory on SOC 10, as will be discussed below, is also configured to maximize switching throughput and minimize costs.

It should be noted that port speeds described are merely exemplary and ports may be configured to handle a variety of speeds faster and slower.

Figure 2:
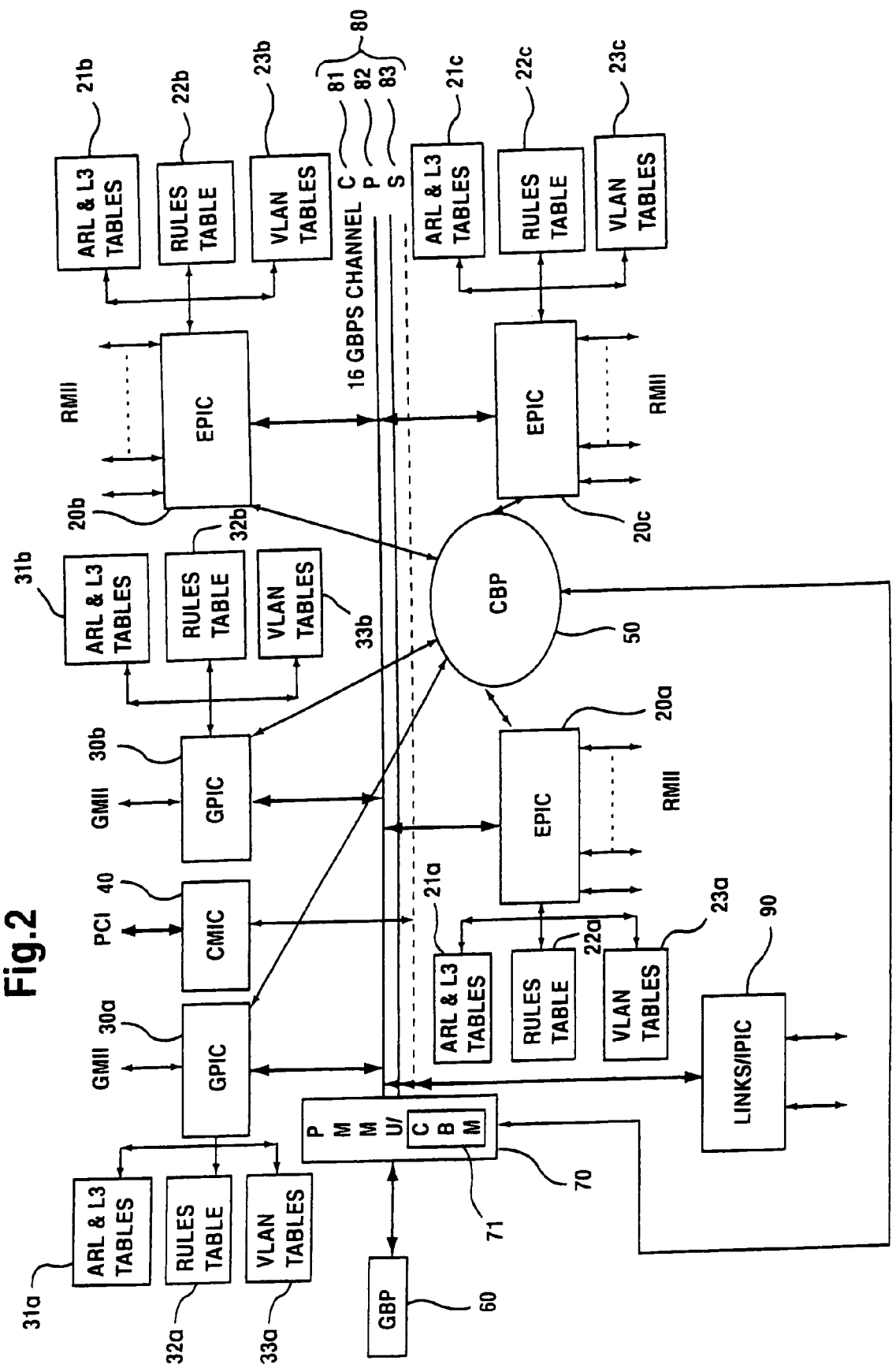
FIG. 2 is a detailed block diagram of a network switch according to the invention.

FIG. 2 illustrates a more detailed block diagram of the functional elements of SOC 10. As evident from FIG. 2 and as noted above, SOC 10 includes a plurality of modular systems on-chip, with each modular system, although being on the same chip, being functionally separate from other modular systems. Therefore, each module can efficiently operate in parallel with other modules, and this configuration enables a significant amount of freedom in updating and re-engineering SOC 10. However, other switch configurations or network device configurations may be utilized to produce the present invention.

SOC 10 may include a plurality of Ethernet Port Interface Controllers (EPIC) 20a, 20b, 20c, etc., a plurality of Gigabit Port Interface Controllers (GPIC) 30a, 30b, etc., a CPU Management Interface Controller (CMIC) 40, a Common Buffer Memory Pool (CBP) 50, a Pipelined Memory Management Unit (PMMU) 70, including a Common Buffer Manager (CBM) 71, and a system-wide bus structure referred to as CPS channel 80. The PMMU 70 includes memory management means and communicates with external memory 12, which includes a Global Buffer Memory Pool (GBP) 60. The CPS channel 80 comprises C channel 81, P channel 82, and S channel 83. The CPS channel is also referred to as the Cell Protocol Sideband Channel, and is a 17 Gbps channel which glues or interconnects the various modules together. As also illustrated in FIG. 2, other high speed interconnects can be provided, as shown as an extendible high speed interconnect. In one configuration, this interconnect can be in the form of an interconnect port interface controller (IPIC) 90, which is capable of interfacing CPS channel 80 to external devices 11 through an extendible high speed interconnect link. As will be discussed below, each EPIC 20a, 20b, and 20c, generally referred to as EPIC 20, and GPIC 30a and 30b, generally referred to as GPIC 30, are closely interrelated with appropriate address resolution logic and layer three switching tables 21a, 21b, 21c, 31a, 31b, rules tables 22a, 22b, 22c, 31a, 31b, and VLAN tables 23a, 23b, 23c, 31a, 31b. These tables will be generally referred to as 21, 31, 22, 32, 23, 33, respectively.

EPIC 20 may support a number of fast ethernet ports 13 (8 are shown as an example), and switches packets to and/or from these ports as may be appropriate. The ports, therefore, are connected to the network medium (coaxial, twisted pair, fiber, etc.) using known media connection technology, and communicates with the CPS channel 80 on the other side thereof. The interface of each EPIC 20 to the network medium can be provided through a Reduced Media Internal Interface (RMII), which enables the direct medium connection to SOC 10. As is known in the art, auto-negotiation is an aspect of fast ethernet, wherein the network is capable of negotiating a highest communication speed between a source and a destination based on the capabilities of the respective devices. The communication speed can vary, as noted previously, for example, between 10 Mbps and 100 Mbps, as an example. Auto-negotiation capability, therefore, is built directly into each EPIC 20 or GPIC 30 module. The address resolution logic (ARL) and layer three tables (ARL/L3) 21a, 21b, 21c, rules table 22a, 22b, 22c, and VLAN tables 23a, 23b, and 23c are configured to be part of, or interface with the associated EPIC in an efficient and expedient manner, in order to support wirespeed packet flow.

Each EPIC 20 and GPIC 30 has separate ingress and egress functions. On the ingress side, self-initiated and CPU-initiated learning of level 2 address information can occur. Address resolution logic (ARL) is utilized to assist in this task. Address aging is built in as a feature, in order to eliminate the storage of address information which is no longer valid or useful. The EPIC and GPIC can also carry out layer 2 mirroring. A fast filtering processor (FFP) 141 may be incorporated into the EPIC, in order to accelerate packet forwarding and enhance packet flow. The EPIC, GPIC, and FFP may request searches in accordance with the present invention.

The ingress side of each EPIC and GPIC has a significant amount of complexity to be able to properly process a significant number of different types of packets which may come in to the port, for linespeed buffering and then appropriate transfer to the egress. Functionally, each port on each module of SOC 10 can have a separate ingress submodule 14 associated therewith. From an implementation perspective, however, in order to minimize the amount of hardware implemented on the single-chip SOC 10, common hardware elements in the silicon can be used to implement a plurality of ingress submodules on each particular module. The configuration of SOC 10 discussed herein enables concurrent lookups and filtering. Layer two lookups, Layer three lookups and filtering occur simultaneously to achieve a high level of performance, which are described in better detail below. On the egress side, the EPIC and GPIC are capable of supporting packet polling based either as an egress management or class of service (COS) function. Rerouting/scheduling of packets to be transmitted can occur, as well as head-of-line (HOL) blocking notification, discussed later herein, packet aging, cell reassembly, and other functions associated with ethernet port interface.

Each GPIC 30 is similar to each EPIC 20, but in this embodiment, supports only one 2.5 gigabit ethernet port, and utilizes a port-specific ARL table, rather than utilizing an ARL table which is shared with any other ports. Additionally, instead of an RMII, each GPIC port interfaces to the network medium utilizing a gigabit media independent interface (GMII).

A CMIC 40 can act as a gateway between the SOC 10 and the host CPU. The communication can be, for example, along a PCI bus, or other acceptable communications bus. CMIC 40 can provide sequential direct mapped accesses between the host CPU 52 and the SOC 10. CPU 52, through the CMIC 40, will be able to access numerous resources on SOC 10, including MIB counters, programmable registers, status and control registers, configuration registers, ARL tables, port-based VLAN tables, IEEE 802.1q VLAN tables, layer three tables, rules tables, CBP address and data memory, as well as GBP address and data memory. Optionally, the CMIC 40 can include DMA support, DMA chaining and scatter-gather, as well as master and target PCI64.

The configuration of the SOC 10 can support fast Ethernet ports, gigabit ports, and extendible interconnect links as discussed above. The SOC configuration can also be "stacked" or "linked", thereby enabling significant port expansion capability. Once data packets have been received by SOC 10, sliced into cells, and placed on CPS channel 80, stacked SOC modules can interface with the CPS channel and monitor the channel, and extract appropriate information as necessary. A significant amount of concurrent lookups and filtering occurs as the packet comes in to ingress submodule 14 of an EPIC 20 or GPIC 30, with respect to layer two and layer three lookups, and fast filtering. One having ordinary skill in the art will readily understand how the switch logic discussed above interacts in order to switch packets from one port to another, as well as perform memory management and other switch functions. For the purposes of describing the present invention, it is not necessary to go into further detail regarding the operations of the internal switch logic.

Figure 3:
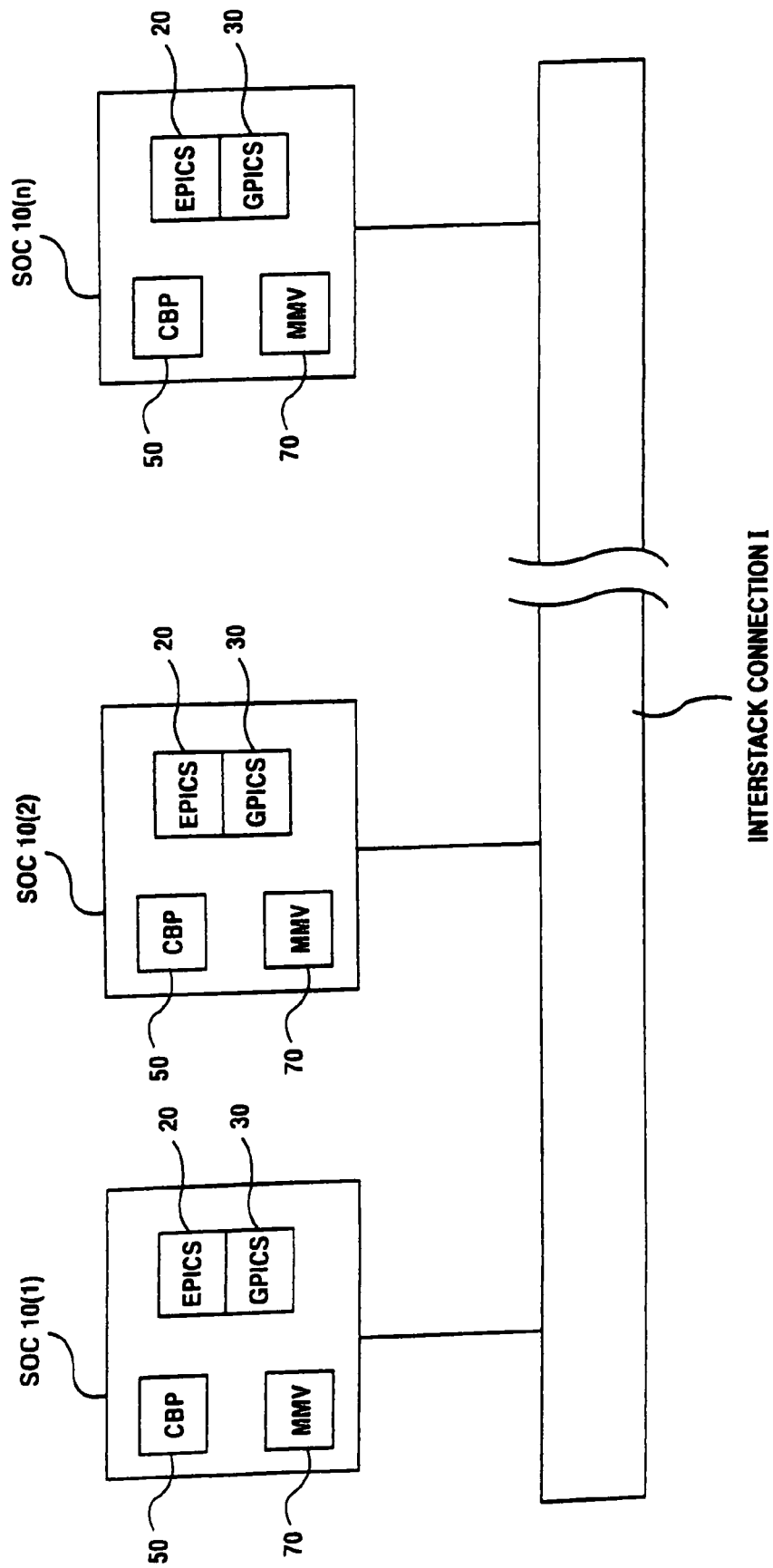
FIG. 3 illustrates an exemplary configuration of linked network devices according to an embodiment of the present invention.

FIG. 3 illustrates an exemplary configuration where a plurality of SOCs 10(1) . . . 10(n) are connected by link ports or interstack links. SOCs 10(1)–10(n) include the elements which are illustrated in FIG. 2. FIG. 3 schematically illustrates CVP 50, MMU 70, EPICs 20 and GPICs 30 of each SOC 10. Interstack connection I is used to provide a stacking configuration between the switches, and can utilize, as an example, at least one gigabit uplink (link port) or other ports of each switch to provide a simplex or duplex stacking configuration as will be discussed below.

Figure 4:
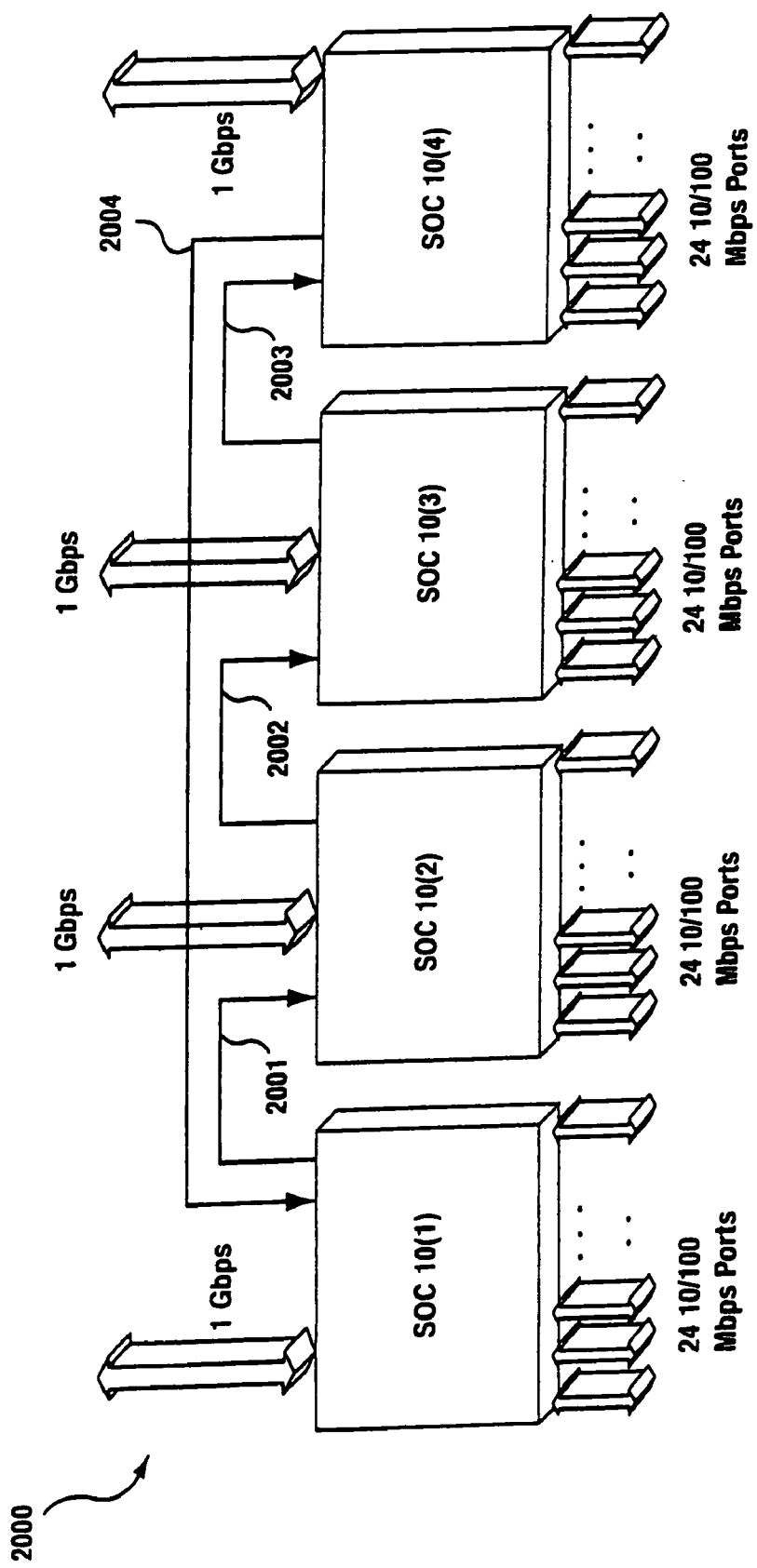
FIG. 4 illustrates another exemplary configuration of linked network devices according to an embodiment of the present invention.

FIG. 4 illustrates a configuration wherein a plurality of SOCs 10(1)–10(4) are connected in a cascade configuration using GPIC modules 30 to create a stack. Using an example where each SOC 10 contains 24 low speed Ethernet ports having a maximum speed of 100 Megabits per second, and two 2.5 gigabit ports (uplinks or link ports). The configuration of FIG. 4, therefore, results in 96 Ethernet ports and 4 usable 2.5 gigabit ports, with four other 2.5 gigabit ports being used to link the stack as what is called a stacked link or interstack link. Interconnection as shown in FIG. 4 results in what is referred to as a simplex ring, enabling unidirectional communication at a rate of 1–2.5 gigabits per second. All of the ports of the stack may be on the same VLAN, or a plurality of VLANs may be present on the stack. Multiple VLANs can be present on the same switch. The VLAN configurations are determined by the user, depending upon network requirements. This is true for all SOC 10 switch configurations. It should be noted, however, that these particular configurations used as examples only, and are not intended to limit the scope of the claimed invention.

Figure 5:
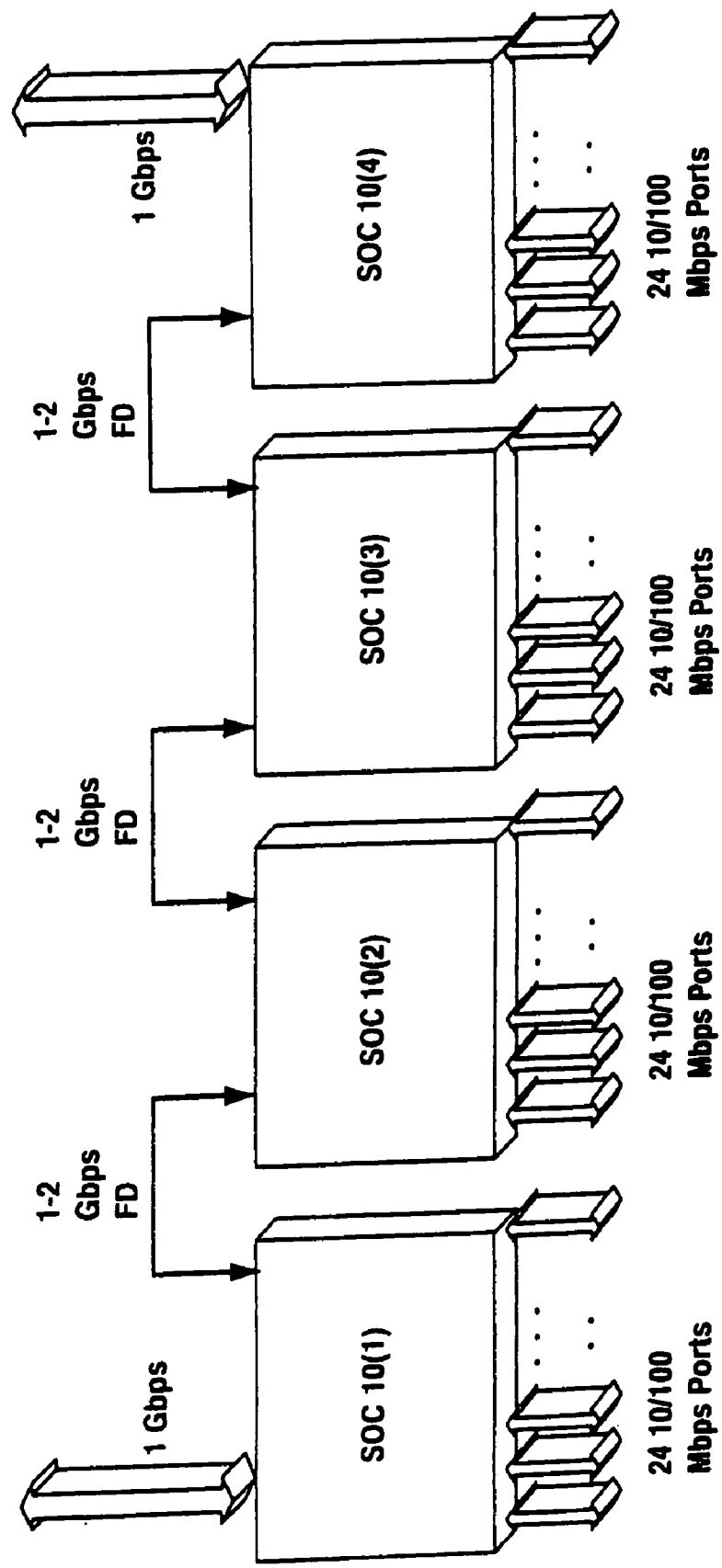
FIG. 5 illustrates another exemplary configuration of linked network devices according to an embodiment of the present invention.

FIG. 5 illustrates a second configuration of four stacked SOC 10 switches, SOC 10(1) . . . 10(4). However, any number of switches could be stacked in this manner. The configuration of FIG. 5 utilizes bi-directional interstack links to create a full duplex configuration. The utilization of bi-directional interstack links, therefore, eliminates the availability of a gigabit uplink for each SOC 10 unless additional GPIC modules are provided in the switch. The only available gigabit uplinks for the stack, therefore, are one gigabit port at each of the end modules. In this example, therefore, 96 low speed Ethernet ports and 2 highspeed Ethernet ports are provided.

Figure 6:
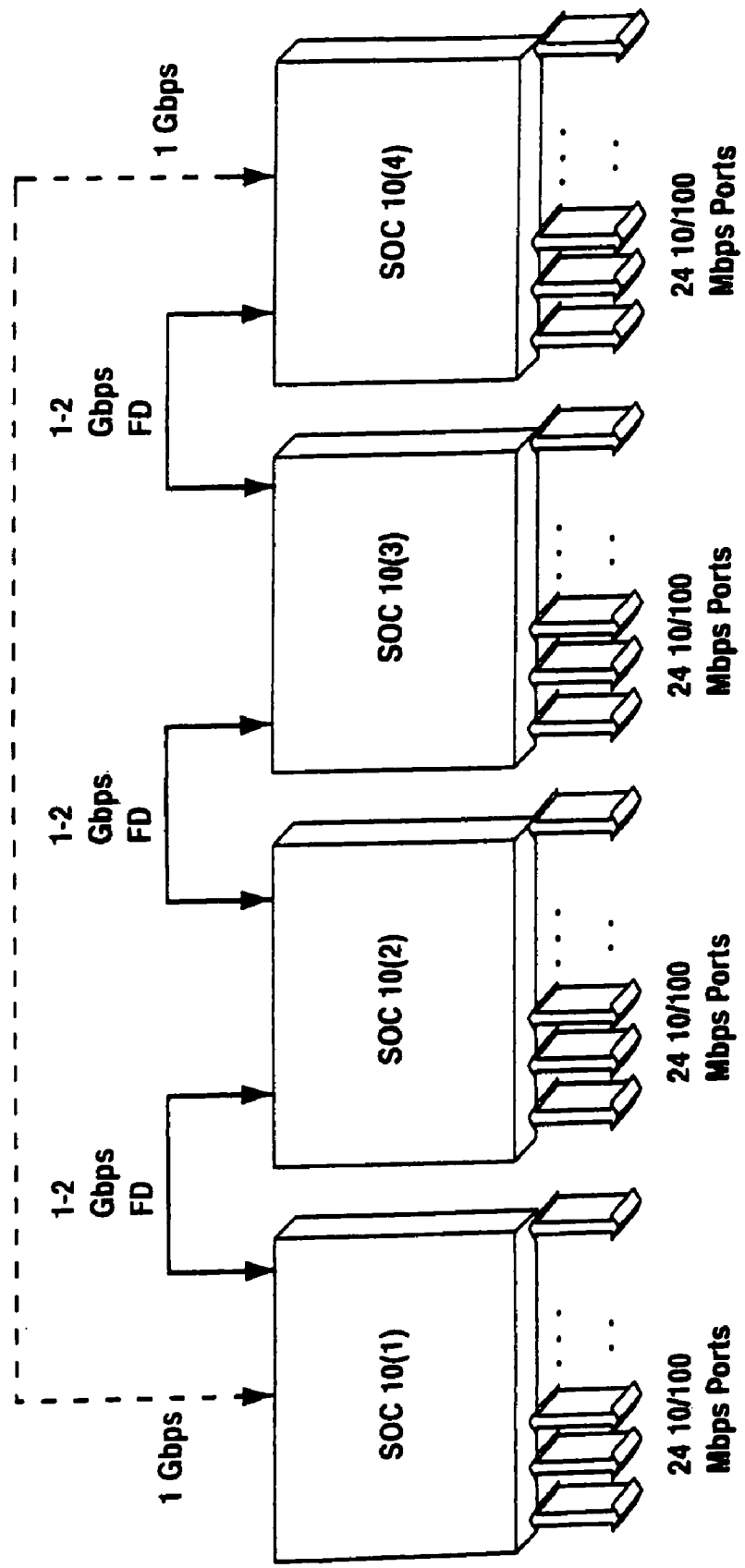
FIG. 6 illustrates another exemplary configuration of linked network devices according to an embodiment of the present invention.

FIG. 6 illustrates a third configuration for stacking four SOC 10 switches. In this configuration, the interconnection is similar to the configuration of FIG. 4, except that the two gigabit ports at the end modules are connected as a passive link, thereby providing redundancy. A passive link in this configuration is referred to in this manner since the spanning tree protocol discussed previously is capable of putting this link in a blocking mode, thereby preventing looping of packets. A trade-off in this blocking mode, however, is that no gigabit uplinks or link ports are available unless an additional GPIC module 30 is installed in each SOC 10. Accordingly, non-blocking linking solutions are preferred.

The following are descriptions of systems and methods of transferring data from one network device to another at double the data rate (DDR) according to the present invention. Such systems and methods may be applied to the above-described switching configurations, particularly with the linking solutions described, but are not limited to the above-described configurations. One having ordinary skill in the art will readily understand the present invention after reviewing the following discussion with reference to the drawing figures in view of the discussions above. In following discussions, like functions and devices are referenced with the numerals.

Described above, a switch may include HOL-blocking functions for queue management and rate control between ports. However, HOL-blocking between individual SOC 10's can cause some problems. Accordingly, non-blocking solutions are desired with which HOL-blocking may be disabled between SOC 10's. In order to provide non-blocking linked switching solutions, the data speed of the interstack link is desired to be 2.5 Gbps or faster. Therefore, in order to design a linking solution that utilizes standard PCB data speeds, a double data rate (DDR) linking solution is described below.

Figure 7:
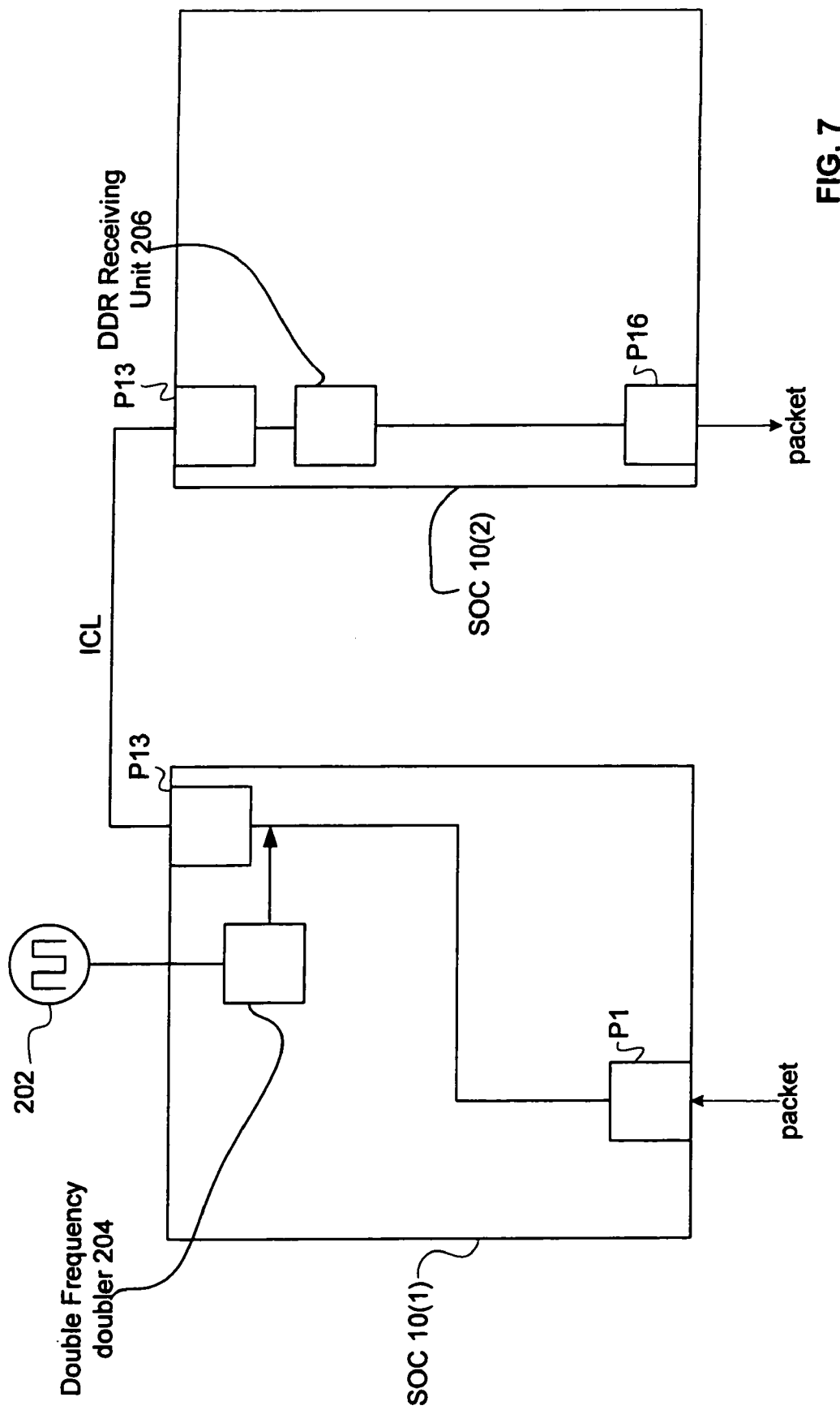
FIG. 7 is a block diagram of linked network devices according to an embodiment of the present invention.

FIG. 7 is a block diagram of two SOC 10's linked together by a link port. In particular, an external clock 202 (duty clock) provides an external clock signal to SOC 10 (1) via an input, which is used by the I/O transmitter of each SOC 10 (only shown on SOC 10 (1)). The clock signal is input to a frequency doubler 204 which is configured to double the frequency of the an input signal and output a signal having the doubled frequency. Accordingly, the frequency doubler 204 outputs a clock cycle having twice the frequency of the external clock signal. When a data packet is received at a port P1 intended to be routed to SOC 10 (2), the packet is internally switched to the link port P13 via internal logic, such as described above with reference to FIGS. 1 and 2. SOC 10(1) includes I/O transmitters and receivers (not shown) or other data I/O devices to output or receive data at its ports. For example, the egress of each port may include rising edge registers which will output data at the rising edge of a reference clock. In this example, the external clock signal after being doubled is applied to the I/O transmitter of SOC 10 (1) and the data is transferred at double the speed of the external clock between linking ports P13 and P14 across the ICL. The data received at P14 is received into a DDR receiving circuit 206 which is configured to receive data and an accompanying clock signal, and sample the data at double data rate as compared to the accompanying clock signal. For example, the DDR receiving circuit 206 may be configured to extract data at both the rising and falling edges of the accompanying clock signal. Accordingly, a clock signal is transmitted with the data packet between ports P13 and P14 (e.g., not shown). Once the packet is received via the DDR receiving unit, SOC 10 (2) handles the packet in accordance with the switching operations to route the packet to a network port, such as port 14, and transmit the packet to another network device.

Figure 8:
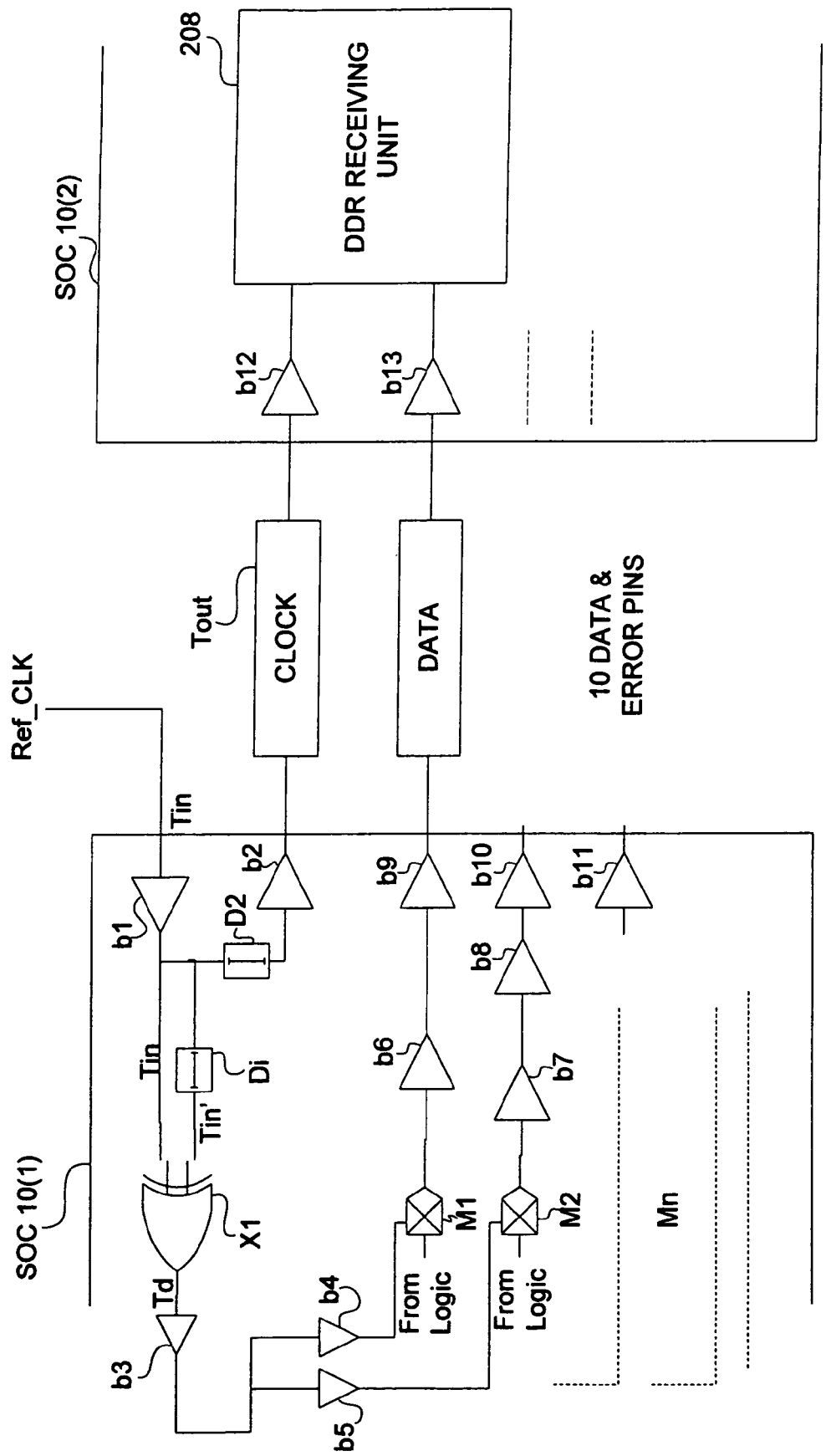
FIG. 8 is a schematic diagram of a link configuration according to an embodiment of the present invention.

Referring now to FIG. 8, a detailed diagram of two switches, SOC 10's, interfaced together via a high-speed link port is shown according to the present invention. In particular, SOC 10 (1) receives a clock signal ref_clk from an external clock, such as a square wave. The clock signal is initially buffered by buffer b1 and the clock is split into two signals. A first signal Tin is fed directly into an exclusive OR gate X1. The second signal is fed to a delay element d1 and is delayed by half a cycle. The delayed signal Tin' is also fed into the exclusive OR gate X1.

Figure 10:
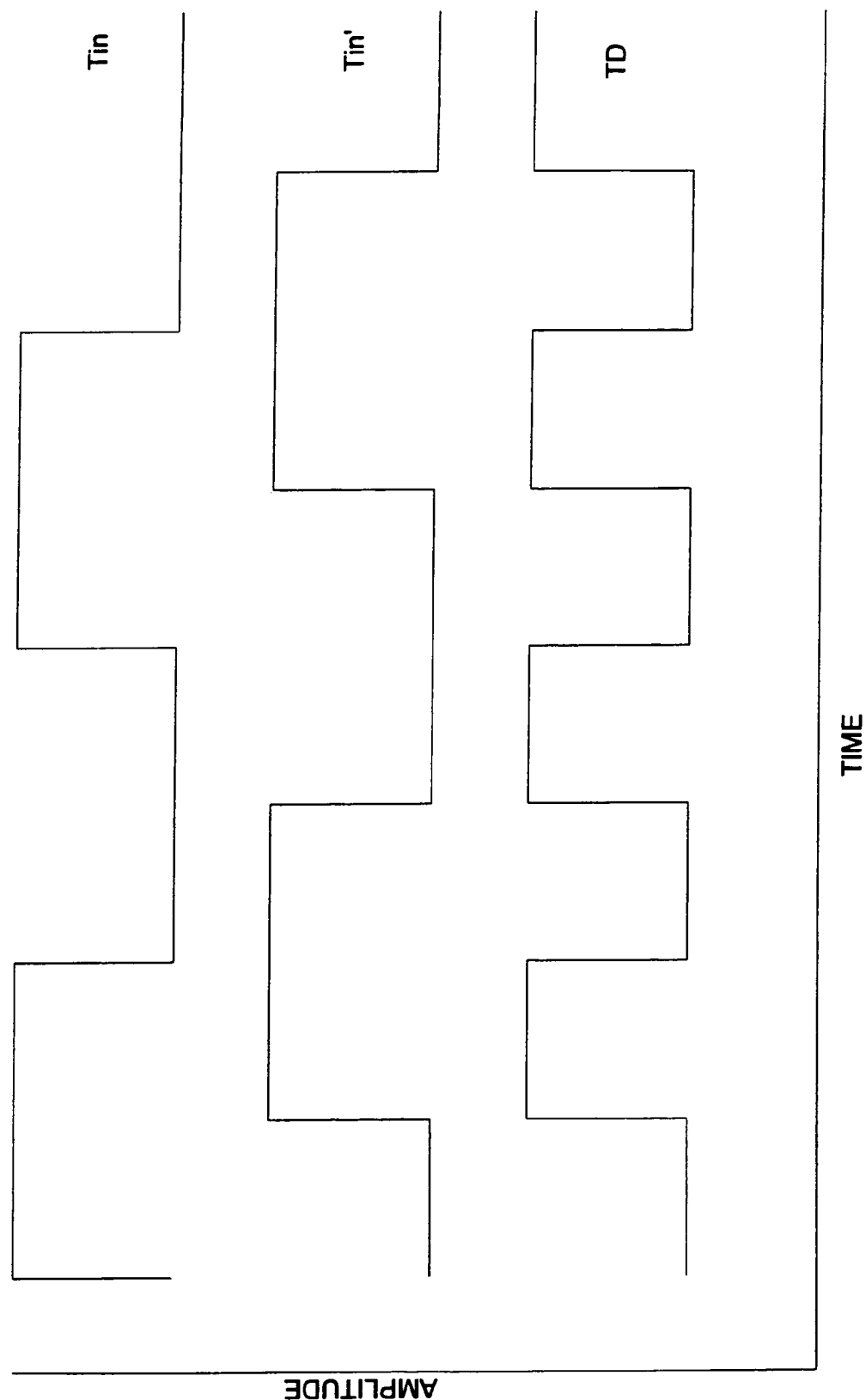
FIG. 10 is a graph of input clock signals and a doubled clock signal according to the present invention.

To better demonstrate the frequency doubler of FIG. 8, reference is made to FIG. 10. Two input signals into the exclusive OR gate X1 and the output signal of the exclusive OR gate X1 are shown. Tin is a square wave clock signal having a cycle length of f. Tin' is the same clock signal delayed by a quarter cycle and therefore also has a cycle length of f but is 90° out if phase with Tin. The output of the exclusive OR gate X1 is shown as having a cycle length of ½ f or is double the frequency of Tin.

One having ordinary skill in the art will readily understand the operations of the exclusive OR gate X1, which produces a 1 or a 0 based on the input signals. An output of 1 is produced from an input of 0 and 0, or 1 and 1. An output of 0 is produced from an input of 1 and 0, or 0 and 1. Accordingly, shown is an exemplary frequency doubler. One having ordinary skill in the art would readily understand that a number of frequency doublers may be used in the present invention to achieve the same results.

Referring back to FIG. 8, clock signal Tin is also split a third time and is input into a delay element D2 into a buffer b2, and output out of the switch SOC 10(1). The clock signal is output in parallel with the data output of the switch so that a receiving switch may have a reference clock signal to use when receiving the data.

The clock signal Td as doubled by the frequency doubler is fed into a buffer b3 and then split a number of times for the number of channels or pins used to transmit data. As an example, 10 data and error pins may be used (8 data pins and 2 error or reserve pins). Accordingly, each doubled clock signal Td is then input into an I/O device used to output data. In this example, rising edge registers M1–Mn, are used to drive the data received from other switching logic, at each rising edge of the input clock signal Td. Each data signal is fed through a series of delay elements B6–B11, preferably variable and programmable, before being output from switch SOC 10 (1). These variable delay elements make up a variable delay circuit that may be varied, such as during testing or configuration of the switch, to align each data signal with each other and/or the clock signal in order to eliminate skew.

Skew may be caused by wiring differences, such as different length circuit paths, between each data pin. These wiring differences may delay the clock signal a different amount between data pins. In a preferred embodiment of the present invention, the IO driver and the receiver are SSTL type. Accordingly, SSTL-2 buffers can be used to reduce noise.

SOC 10(2) receives the data and the clock signals, buffers them both in buffers b12 and b13, and then inputs the signals into a DDR 208 receiver, which may, for example, be a gate array. Accordingly, data is received on both the rising edge and the falling edge of the clock signal Tout which has a frequency of ½ of the clock signal Td that is used to drive the data. However, the data driver only drives the data on the rising edge of the clock, and therefore, the DDR receiving unit 208 receives data synchronized with the rising and falling edge of the output clock of switch SOC 10(1).

According to a preferred embodiment of the present invention, 10 one-way pins (not shown) are used to drive data from one switch SOC 10(1) to another switch SOC 10(2). Accordingly, in this embodiment, switch SOC 10(1) and switch SOC 10(2) are connected by 20 data pins via a circuit (not shown). As a result, a data rate of 2.5 Gbps may be obtained between switching with an external clock speed of 156 MMz.

According to an embodiment of the present invention, the basic chip design of each SOC 10 may be computer generated for each chip and is referred to as an application specific IC design (ASIC). ASIC designs are used to shorten design cycles and improve manufacturing, and therefore are preferred. A software tool may be used to predict signal delays for each data pin based on the ASIC design. For example, the BROADCOM CORP. developed a library which may be used to accurately predict the delay based on varying wiring lengths within a chip. Using the library, it can be determined how to calibrate the variable delay circuit by selecting the value for each delay elements (i.e., by changing the design or by programming the delay elements which might be programmable) in order to reduce skew between individual data circuits and to synchronize the data signals with the each other and the output clock signal Tout.

Figure 9:
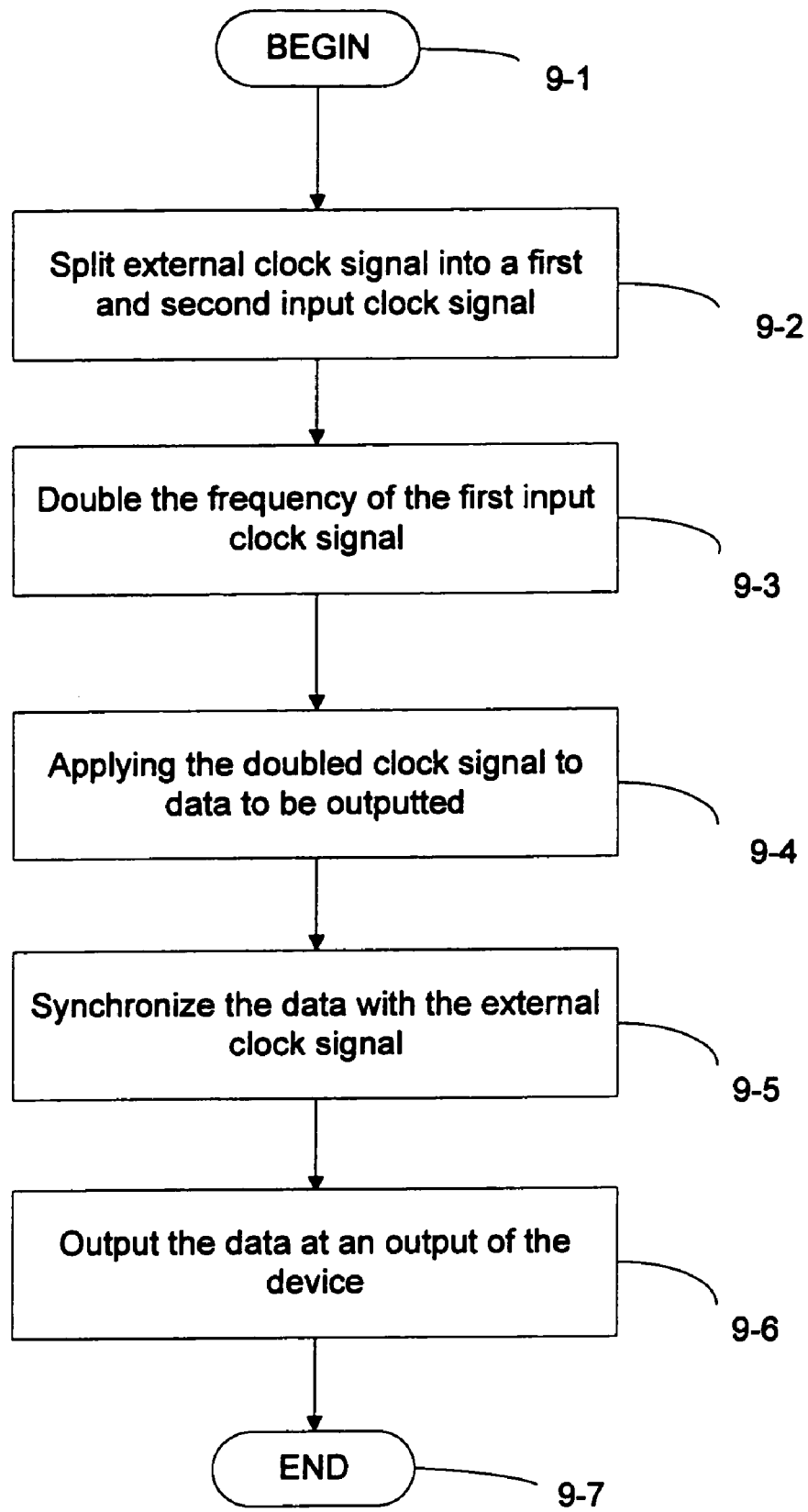
FIG. 9 is a flow chart of a method for linking network devices according to an embodiment of the present invention.

Referring to FIG. 9, shown is a flow chart of a method for linking network devices according to the present invention. Processing begins at step S9-1 and proceeds to step S9-2 immediately. At step S9-2, an external clock signal is split internally into a first and second clock signal. For example, as described above, a network device (e.g., SOC 10) may receive an external clock signal from a clock on a PCB via an input. A circuit may be provided to split the clock signal into two clock signals.

Next at step S9-3, one of the signals is doubled in frequency. As described above, various methods may be utilized to double the frequency of the signal. For example, the clock signal may be split again, and one of the clock signals can be delayed 90° out of phase with the other. Then, the two signals can be input into an exclusive OR gate which will output a clock signal having twice the frequency of the input signals.

Next at step S9-4, the doubled clock signal is applied to data to be output of the device. For example, in a switch, a data packet being transferred across the interstack link between linked switched is output to the port by an I/O device. The doubled clock signal may be used as a reference clock by the I/O device. As described above, the doubled clock signal Td is input to rising edge registers, which drive the data on the rising edge of the square wave.

Next at step S9-5, the data is synchronized with the external clock. For example, as described above with reference to FIGS. 7 and 8, a circuit may provide the second input clock signal (external clock) to the output of the device, such as the link port, to be output as a reference clock signal to the data. Also, the data may be divided into portions and transmitted via a number of pins in parallel. Therefore, each data portion in parallel should be synchronized (centered on the rising and falling edges) with the reference clock and with each other to prevent skew. A variable delay circuit may be provided, for example, between the I/O device and that data pins, to individually delay each signal. The delay for each signal can be varied to synchronize the data and the clock. The variable delay circuit may include programmable delay elements that can be varied during the initial configuration of the device, or alternatively, the delay elements may be set during the design process.

Next, at step S9-6, the data and the clock are output of the device. As described above, a link port may be used to output the data and the clock, and therefore, a circuit may be provided between the pins of the device and of a device receiving the data. As described above, the device receiving the data should include a DDR receiving unit, which is configured to sample the data at the rising and the falling edge of the reference clock.

Processing terminates at step S9-7.

The above-described configuration has the disadvantage that material speed variations caused by process or operating condition may decrease the manufacturing a yield of network devices that produce a desired DDR clock speed. This is because synchronization between the output clock and the double frequency clock signal used to drive the data might not be accomplished. The delay circuit used to synchronize the output clock signal with the data output signals may be susceptible to process and operating conditions (e,g, temperature and voltage variations vary the speed of the material of the chip). Therefore, a number of devices manufactured by the above-configuration might not attain the DDR clock speed because of skew between the output clock signal and the data output signals. Accordingly, below is described another configuration for linking network devices at double data rate in which the output clock and the clock used to drive the data may be synchronized independent of effects caused by process and operating conditions.

Figure 11:
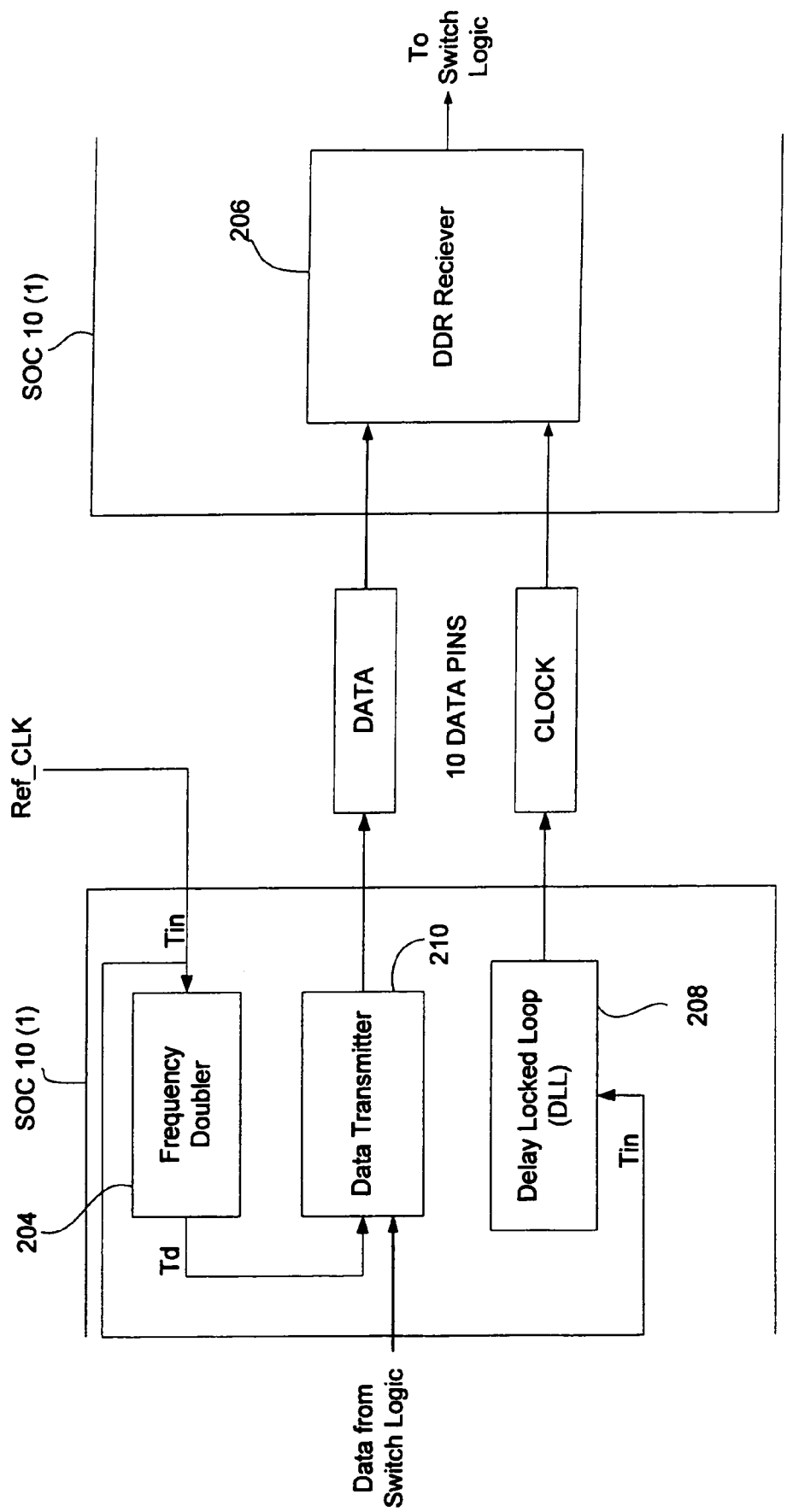
FIG. 11 is a block diagram of a second link configuration according to an embodiment of the present invention.

FIG. 11 is a block diagram of an embodiment of the present invention. In particular, SOC 10(1) includes a frequency doubler 204 and a data transmitter 210 as described in previous configurations. SOC 10(1) also includes a delay locked loop (DLL) 208 for precise dynamic adjustment of the SSO clock signal (Tout).

An external clock is provided (not shown), such as on a PCB, to input a reference clock Ref_CLK (Tin) to a device input of SOC 10 (1), such as a pad on the chip. Clock signal Tin is split, one branch being input into frequency doubler 204, and the second branch being input into the DLL 208. Frequency doubler 204 outputs a signal Td having a frequency double of the frequency Tin. Doubled clock signal Td is input to the data I/O transmitter or device 210 and is applied to data to be output. For example, in a switch, a data packet may be routed from SOC 10(1) to SOC 10(2). As described above with reference to FIGS. 1 and 2, SOC 10(1) includes internal logic to process the data packet and route the data packet to the appropriate port. The data packet may be output of SOC 10(1) via data I/O transmitter 210 based on the reference clock (Td) input into the data transmitter 210. For example, rising edge registers may be used to drive data that it receives from internal switch logic, on the rising edge of the reference clock signal. As a result, data will be driven at a speed equal to the cycle speed of the reference clock Td.

DLL 208 receives as an input the external clock signal Tin and delays Tin and outputs delayed Tin as Tout. DLL 208 includes a feedback loop (not shown) and is configured to measure the phase difference between the input clock signal and the feedback loop signal and generate an error signal based on the phase difference, then to adjust the delay of Tin until the error signal becomes zero. Once the error is reduced to zero, signals Tout and Td are synchronized. DLL 208 may be a programmable delay locked loop, and the error may be set to zero based on a preset phased angle difference measured between the two input signals. For example, in the present configuration, since Td has a frequency twice that of Tin, in order to center data driven by the rising edge of Td with the rising and falling edges of Tin, Tin is delays 90 degrees out of phase. Accordingly, this increases the probability that SOC 10(1) will transmit data at DDR.

The data output from data transmitter 210 and clock signal Tout are transmitted to SOC 10(2), such as via a circuit or interstack link, which may be a bus. SOC 10(2) includes a DDR receiver 206, which receives the clock signal Tout and the data signals, and samples the data at the rising edge and the falling edge of Tout. The DDR receiver 206 extracts the data and passes it to the appropriate internal switch logic for routing and handling.

Figure 12:
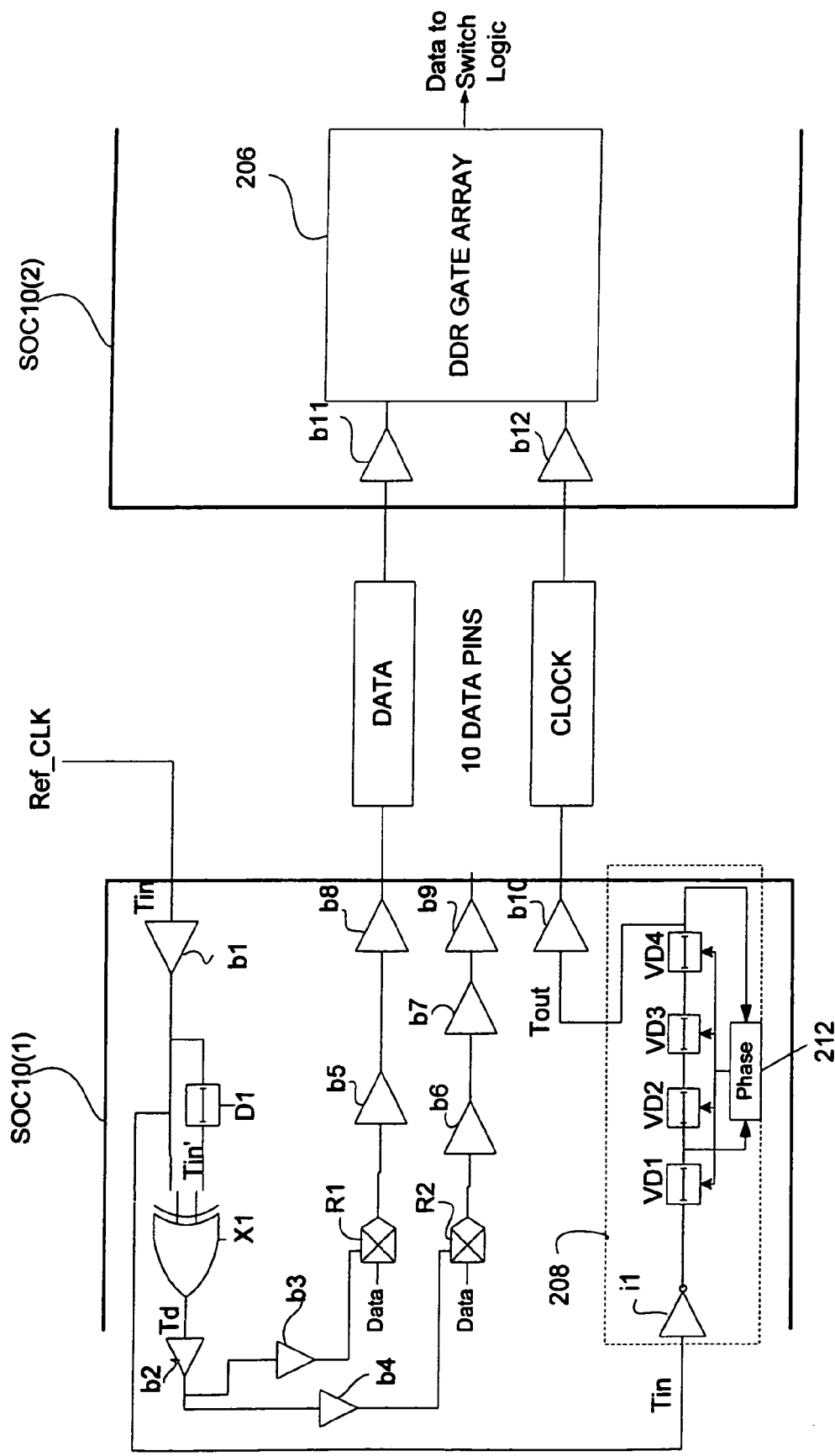
FIG. 12 is a schematic diagram of a second link configuration according to an embodiment of the present invention.

FIG. 12 is a detailed diagram of the configuration of FIG. 11, according to the present invention. The reference clock signal Ref_CLK is input to SOC 10(1) at a device input, such as a pad. The Ref_CLK signal may be input from an external clock, such as a duty clock on a PCB (not shown). The input clock signal Tin is buffered in a buffer B1 and then split into three clock signals. A first clock signal is input into a delay element D1 which delays signal Tin a quarter cycle out of delay, and outputs signal Tin'. Tin and Tin' are input into an exclusive or gate X1 which outputs a signal Td having a frequency double that of input signal Tin, as already described above with reference to FIGS. 7 and 8. Doubled clock signal Td is split a number of times corresponding to the number of output channels or pins used for transmitting data out of device SOC 10(1) across the interstack link. For example, 10 data pins may be used, and accordingly, signal Td would be split 10 times. Each Td will be input into a rising register which drives data at the rising edge of a reference clock. Accordingly, each rising edge register R1–Rn receives data from internal switch logic and outputs the data at the rising edge of clock signal Td, at a data speed equal to the frequency of Td. One having ordinary skill in the art will readily understand that the internal switch logic processes and routes data within the switch as well as slicing the data into portions to be output at each pin.

The third branch of signal Tin is input into the delay locked loop 208 which includes an inverter I1, a delay line VD1–VD4 feeding back to a phase comparator 212. Clock signal Tin is inverted in inverter I1, and the output of inverter I1 is fit into the delay line and into phase comparator 212. The delay line is made up of a number of variable delay elements VD1–VDN, which may have a coarse delay and a fine delay. For example, a delay element having a coarse delay can be varied between 1 unit of delay and 4 units of delay, while a delay element having a fine delay might only be varied between 1 unit delay and 2 units delay. Initially, the delay line is configured to be at the lowest delay, and all delay elements are set to its lowest unit of delay. Variable delay elements may be turned ON and OFF, for example, by sending a control signal of a 1 or 0; 1 being ON or the high delay amount, and 0 being OFF or the low delay amount. Accordingly, at initiation, all delay elements are set by a control signal of all 0's (i.e., a 0 signal for each element). The delay line is controlled by control signal sent from phase comparator 212. Phase comparator 212 receives a feedback from the output of the delay line and also receives input of a signal Tin inverted. Phase comparator 212 compares the phase of each signal and is configured to generate an error signal based on the phase angle difference measured. Phase comparator 212 can be configured to increase the delay of the delay line by sending a control signal to control the variable delay elements VD1–VDN until the error generated is equal to 0, or until a preset phase angle difference is detected. For example, in a preferred embodiment of the present invention, the delay line may include 16 delay elements, 8 fine and 8 coarse, and phase comparator 212 may generate a 16-bit control signal. In this example, the phase comparator will initialize the control signal with all 0's and increment the control signal by 1 until the error is 0. One having ordinary skill in the art will readily understand that if the delay required to obtain the desired phase difference between the signals is large, then variable delay elements having a coarse delay can be turned ON first until the error becomes 0 or negative. Then fine delay may be used until the error is 0. If the error becomes negative, a variable delay element having coarse delay can be turned OFF, then fine delay can be used until the error is 0. Accordingly, using feedback from the delay loop and comparing the feedback to the inverted input signal, the delay locked loop 208 is capable of outputting a signal having a preset phase difference from an input signal automatically, independent of effects caused by process or operating conditions. This is because whether process or operating conditions change the speed of the material of the chip, the variable delay line having both coarse and fine delay elements can be varied until the output signal is exactly out of phase from the input signal as desired. Furthermore, the on-chip delay of both signals Td and Tin, into DLL 203, can be designed to be the same, and DLL 203 can be custom placed at the clock output pin to guarantee data synchronization. Therefore, an output signal Tout can be produced in parallel with the data, such that data output of SOC 10(1) is centered on the rising and falling edges of output clock signal Tout. The data end clock signals are received at the link port of SOC 10(2), or buffered with buffers B11 and B12, and are input into a DDR receiving unit 206, which may be gate array. As described above, DDR receiver unit 206 is configured to receive input data signals and an input clock signal, and sample data from the data signals at the rising and falling edges of the input clock signal. Then the extracted data is output to internal switch logic (not shown) to be handled appropriately.

Also shown is a variable delay circuit including variable delay elements B5–B9 which operates as described above with reference to FIGS. 7 and 8 in order to reduce between each data signal. As a result, a system for linking two SOC 10s is provided which allows data to be transferred at double data rate in accordance with the present invention.

Figure 13:
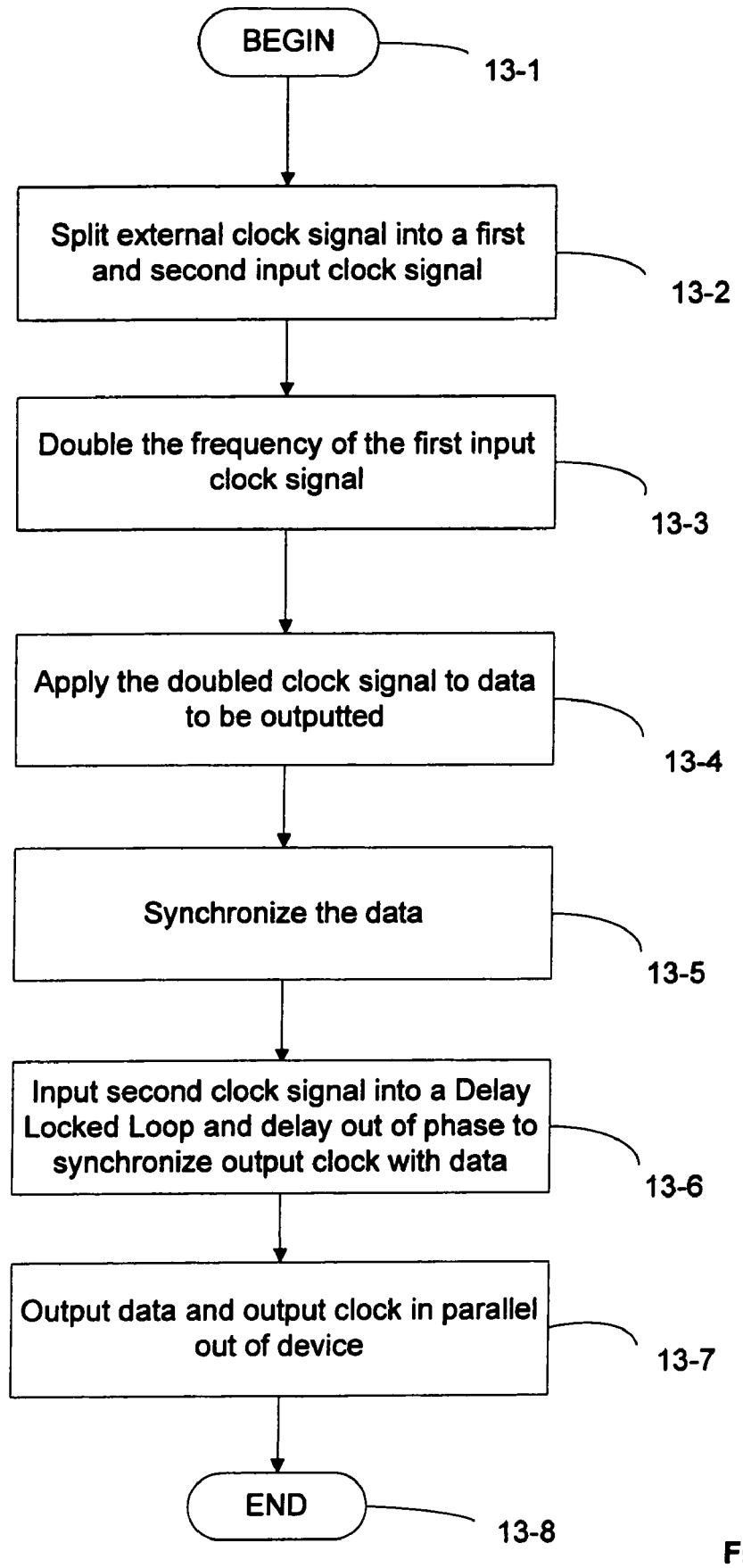
FIG. 13 is a flow chart of a method for linking network devices according to an embodiment of the present invention.

FIG. 13 is a flow chart of a method for linking network devices according to the present invention. Processing begins at step S13-1 and proceeds to step S13-2 immediately. At step S13-2, an external clock signal is split internally into a first and second clock signal. For example, as described above, a network device (e.g., SOC 10) may receive an external clock signal from a clock on a PCB via an input. A circuit may be provided to split the clock signal into two clock signals.

Next, at step S13-3, one of the signals is doubled in frequency. As described above, various method may be utilized to double the frequency of the signal. For example, the clock signal may be split again and one of the clock signals can be delayed 90° out of phase with the other. Then, the two singles can be put into an exclusive or gate which will output a clock signal having twice the frequency of the input signals.

Next, at step S13-4, the doubled clock signals are applied to data the output of the device. For example, in a switch, a data packet is transferred across the interstack link between link switches is output to a link port of the switch by an I/O device. The double clock signal may be used as a reference clock by the I/O device. As described above, the double clock signal Td may be input to rising edge registers which drive the data on the rising edge of the square wave. Next, at step S13-5, the data is synchronized. For example, as described above, a variable delay circuit may be provided for variably delaying each data output signal to reduce skew between the signals. The variable delay circuit may be configured during start-up of the device or during design.

Next, at step S13-6, the second clock signal is input into a delay locked loop and delayed out of phase to synchronize the output clock with the data. As described above, the delay locked loop automatically delays an input signal out of phase a preset amount. According to the present invention, the output clock can be delayed 90° out of phase such that data driven by doubled clock signal Td is centered on the rising and falling edges of the output signal. An exemplary delay locked loop is described above with reference to FIGS. 11 and 12.

Next, at step S13-7, the data and the clock are output of the device in parallel. As described above, a link port may be used to output the data and the clock, and therefore a circuit may be provided between the pins of the device and of a receiving device which receives the data. As described above, the device receiving the data should include a DDR receiving unit configured to sample and extract data at the rising and falling edges of the output clock. An exemplary linked device is shown and described with reference above to FIGS. 11 and 12.

Processing terminates at step S13-8.

Accordingly, by the above described configurations and processes, the present invention provides novel systems and methods for linking network devices at high speeds using double the data rate (DDR) and a delay locked loop to synchronize the output clock with the data. These systems and methods allow for network devices to be produced of higher performance and at a higher yield.

Although the invention has been described based upon these preferred embodiments, it would be apparent to those of skilled in the art that certain modifications, variations, and alternative constructions would be apparent, while remaining within the spirit and scope of the invention. For example, any network device may benefit from the described systems and methods for transmitting data between device. Also, other switch configurations could be used to take advantage of the invention. In order to determine the metes and bounds of the invention, therefore, reference should be made to the appended claims.

The invention claimed is:

1. A network device comprising:
   a frequency doubler configured to receive an external clock signal and output a reference clock signal having double the frequency of the external clock signal;
   a data I/O device and configured to output data based upon the reference clock signal; and
   a programmable delay locked loop configured to receive the external clock signal and to automatically output an output clock signal being a predetermined amount out of phase from the input signal and having a frequency equal to a frequency of the external clock signal.

2. The network device of claim 1, wherein said frequency doubler comprises a circuit for splitting said external clock signal into a first and second clock signal, a delay element for delaying at least one of said first and second clock signal, and an element for integrating said first and second clock signal into said doubled clock signal.

3. The network device of claim 2, wherein said element for integrating said first and second clock signals comprises an exclusive OR gate downstream of said delay element.

4. The network device of claim 1, said network device comprising a network switch, and wherein at least one port of the network device is configured for linking said switch to another network device.

5. The network device of claim 4, wherein said at least one port is configured to transmit and receive data at a speed of 2.5 Gbps.

6. The network device of claim 5, further comprising:
   a variable delay circuit coupled to an output of said data I/O device,
   wherein said at least one port comprises a plurality of data pins for outputting said data in portions, a speed of said external clock signal is 156 kHz, and said variable delay circuit being applied to said data in order to prevent skew between said each portion of said data.

7. The network device of claim 6, wherein said variable delay circuit comprises a plurality of programmable delay elements.

8. The network device of claim 1, wherein said programmable delay locked loop comprises:
   a phase comparator;
   a delay line comprising a plurality of variable delay elements;
   a feedback loop feeding back an output of said delay line to said phase comparator;
   wherein the input signal of said programmable delay locked loop is input to said phase comparator and compared to the output of said delay line, said phase comparator detecting an error between said input signal and said output of said delay line and adjusting the delay of said delay line until said error is equal to zero.

9. The network device of claim 8, wherein said plurality of delay elements include a first group of delay elements producing a first and a second delay amount, and a second group of delay elements producing a third and fourth delay amount, said first and second delay amounts being greater than twice that of said third and fourth delay amounts, respectively.

10. The network device of claim 9, wherein said phase detector increasingly delays of the output of said delay line by adjusting said first group of delay elements until a fine delay adjustment is required, then adjusting said second group of delay elements.

11. The network device of claim 9, wherein said error is detected to be zero when said input signal and said delay line output are 90 degrees out of phase.

12. The network device of claim 9, wherein an inverter is placed between a device input and an input of said programmable delay locked loop.

13. The network device of claim 1, wherein an inverter is placed between a device input and an input of said programmable delay locked loop.

14. A network device comprising:
   a frequency doubler means configured to receive an external clock signal and outputting a reference clock signal having double a frequency of the external clock signal;
   a data I/O means for outputting data based upon the reference clock signal; and
   a programmable delay locked loop means configured to receive the external clock signal and automatically outputting an output clock signal being a predetermined amount out of phase from the input signal and outputting an output clock signal having a frequency equal to the frequency of the external clock signal, said output clock signal being in synchronization with said doubled clock signal.

15. The network device of claim 14, wherein said frequency doubler means comprises a circuit for splitting said external clock signal into a first and second clock signal, a delay means for delaying at least one of said first and second clock signal, and an integration means for integrating said first and second clock signal into said doubled clock signal.

16. The network device of claim 15, wherein said integration means comprises an exclusive OR gate downstream of said delay element.

17. The network device of claim 16, said network device comprising a switch means, and wherein at least one port of the network device is configured for linking said switch means to another network device.

18. The network device of claim 17, wherein said at least one port is configured to transmit and receive data at a speed of 2.5 Gbps.

19. The network device of claim 18, further comprising:
   variable delay circuit means coupled to an output of said data I/O device means,
   wherein said at least one port comprises a plurality of data pin means for outputting said data in portions, a speed of said external clock signal is 156 kHz, and said variable delay circuit means being applied to said data in order to prevent skew between said each portion of said data.

20. The network device of claim 19, wherein said variable delay circuit means comprises a plurality of programmable delay elements.

21. The network device of claim 14, wherein said programmable delay locked loop means comprises:
   a phase comparator means for detecting an error between a first and second input signal based on the phase difference between said first and second input signals;
   a delay line means comprising a plurality of variable delay elements;
   a feed back loop means for feeding back the output of said delay line means to said phase comparator means;
   wherein the input signal of said programmable delay locked loop means is input to said phase comparator means, said phase comparator detecting an error between said input signal and said output of said delay line means and adjusting the delay of said delay line means until said error is equal to zero.

22. The network device of claim 21, wherein said plurality of variable delay elements include a first group of variable delay elements producing a first and a second delay amount, and a second group of variable delay elements producing a third and fourth delay amount, said first and second delay amounts being greater than twice that of said third and fourth delay amounts, respectively.

23. The network device of claim 22, wherein said phase comparator means increasingly delays of the output of said delay line means by adjusting the first group of variable delay elements until a fine delay adjustment is required, then adjusting said second group of variable delay elements.

24. The network device of claim 22, wherein said error is detected to be zero when said input signal and said delay line output are 90 degrees out of phase.

25. The network device of claim 22, wherein an inverter is placed between a device input means and an input of said programmable delay locked loop means.

26. The network device of claim 14, wherein an inverter is placed between a device input means and an input of said programmable delay locked loop means.

* * * * *